United States Patent
Kobayashi et al.

(10) Patent No.: US 7,153,785 B2
(45) Date of Patent: Dec. 26, 2006

(54) METHOD OF PRODUCING ANNEALED WAFER AND ANNEALED WAFER

(75) Inventors: Norihiro Kobayashi, Gunma (JP); Masaro Tamatsuka, Gunma (JP); Takatoshi Nagoya, Gunma (JP); Wei Feig Qu, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/487,405

(22) PCT Filed: Aug. 23, 2002

(86) PCT No.: PCT/JP02/08516

§ 371 (c)(1),
(2), (4) Date: Feb. 23, 2004

(87) PCT Pub. No.: WO03/021660

PCT Pub. Date: Mar. 13, 2003

(65) Prior Publication Data

US 2004/0192071 A1    Sep. 30, 2004

(30) Foreign Application Priority Data

Aug. 30, 2001    (JP) ............................. 2001-260777

(51) Int. Cl.
*H01L 21/31* (2006.01)
*H01L 21/469* (2006.01)

(52) U.S. Cl. ................. 438/770; 438/773; 257/E21.24; 257/E21.28

(58) Field of Classification Search ................ 438/795, 438/473, 770, 773; 257/E21.24, E21.282, 257/E21.283, E21.284, E21.285

See application file for complete search history.

(56) References Cited

U.S. PATENT DOCUMENTS

| 5,788,763 | A | 8/1998 | Hayashi et al. |
| 5,931,662 | A * | 8/1999 | Adachi et al. .................. 432/6 |
| 6,204,188 | B1 * | 3/2001 | Abe et al. .................... 438/706 |

(Continued)

FOREIGN PATENT DOCUMENTS

EP    1 035 236 A1    9/2000

(Continued)

OTHER PUBLICATIONS

Dornberger et al. "Silicon crystals for future requirements of 300 mm wafers", Journal of Crystal Growth 229 (2001) pp. 11-16.

*Primary Examiner*—Caridad Everhart
(74) *Attorney, Agent, or Firm*—Oliff & Berridge, PLC

(57) ABSTRACT

The present invention provides method of producing an annealed wafer wherein a silicon single crystal wafer produced by the Czochralski (CZ) method is subjected to a high temperature annealing in an atmosphere of an argon gas, a hydrogen gas, or a mixture gas thereof at a temperature of 1100–1350° C. for 10–600 minutes, during the annealing the silicon single crystal wafer is supported by a supporting jig only in a central side region of the wafer except for 5 mm or more from a peripheral end of the wafer, and before performing the high temperature annealing, a pre-annealing is performed at a temperature less than the temperature of the high temperature annealing to grow oxide precipitates. Thereby, there is provided a method of producing an annealed wafer wherein slip dislocations generated in a high temperature annealing can be suppressed even in the case of a silicon single crystal wafer having a large diameter of 300 mm or more, and provided the annealed wafer.

9 Claims, 1 Drawing Sheet

(a) BOAT 1

(b) BOAT 2

(c) BOAT 3

U.S. PATENT DOCUMENTS 6,462,411 B1 * 10/2002 Watanabe et al. ........... 257/723
6,478,883 B1    11/2002 Tamatsuka et al. ........ 148/33.2
6,576,064 B1 *  6/2003 Torres et al. ............... 118/728

FOREIGN PATENT DOCUMENTS

| JP | A 5-144761 | 6/1993 |
| JP | A 8-17753 | 1/1996 |
| JP | A 8-250506 | 9/1996 |
| JP | A 9-190954 | 7/1997 |
| WO | WO 00/12787 | 3/2000 |

* cited by examiner (a) BOAT 1

(b) BOAT 2

(c) BOAT 3

METHOD OF PRODUCING ANNEALED WAFER AND ANNEALED WAFER

TECHNICAL FIELD

The present invention relates to a method of producing an annealed wafer and an annealed wafer, particularly relates to a method of producing an annealed wafer and an annealed wafer wherein the generation of slip dislocations is lowered even in the case of a wafer having a large diameter.

BACKGROUND ART

Recently, high integration and fineness have been promoted in a device process, and the integrity of a device active region in a surface layer and the improvement of gettering ability to capture impurities such as metals caused by increase of bulk micro defects (BMD) formed by oxide precipitates in a bulk have been required of a silicon wafer.

In response to these requirements, various approaches have been attempted. For example, in order to eliminate defects (mainly grown-in defects) on a wafer surface, it has been performed that a wafer obtained by the Czochralski method (CZ method) is subjected to a high temperature heat treatment (annealing) in an atmosphere of an argon gas, a hydrogen gas, or a mixture gas thereof at a temperature of 1100–1350° C. for 10–600 minutes. In this high temperature annealing, the reason why the temperature of the high temperature annealing is 1100° C. or more is to effectively eliminate defects, and by setting the temperature at 1350° C. or less, problems such as deformation and metal contamination of a wafer can be prevented.

However, in the case that a silicon wafer having a diameter of 200 mm or more is subjected to the high temperature annealing as described above, slip dislocations, which penetrate a wafer from its back side to the front, are remarkably generated, and they have been detected by a visual inspection and a particle counter.

It is known that such slip dislocations are generated mainly due to the weight of a wafer itself, and there is a tendency that as the diameter of the wafer is more increased, these slip dislocations is easy to be generated. Namely, as compared to the case that a silicon wafer having a diameter of 200 mm is subjected to a high temperature annealing, when a silicon wafer having a large diameter of 300 mm or more is subjected to a high temperature annealing, the generation of slip dislocations are remarkably increased, and it is extremely difficult to prevent the generation. Such slip dislocations are further grown in a device process, they cause a failure in a device process, and they have been one of factors of lowering a yield.

Also, in general, when a high temperature annealing is performed, a wafer supporting jig (boat) has been used for supporting a wafer and a three-point or four-point supporting jig has been usually used. However, when a wafer is supported by a four-point supporting boat, a stress applied to each one of four points must be less than that applied to each one of three points in theory. However, in fact, seen from a tendency of the generation of slip dislocations in an annealed wafer, slip dislocations are generated from three out of four points. From this fact, it is found that stresses are not applied uniformly to four points when a wafer is suppressed, and a wafer is supported mainly by three out of four points, i.e., stresses are applied non-uniformly to a wafer. On the other hand, when a wafer is supported by using a three-point supporting boat, since stresses are applied uniformly to three point, the stresses are more dispersed as compared to the four-point supporting boat, but slip dislocations are generated in the annealed wafer subjected to a high temperature annealing.

As a method of suppressing such slip dislocations, a method of optimizing a temperature increasing rate or the like has been generally known. However, by optimizing a temperature increasing rate, the temperature increasing rate becomes slow, which is substantially equal to the extension of the annealing time at a high temperature, and thus, this can not be a fundamental solution for suppressing slip dislocations. Moreover, the time required for an annealing process is prolonged, and, as a result, it has caused the deterioration of the productivity.

DISCLOSURE OF THE INVENTION

The present invention was accomplished in view of the problems mentioned above, and the object of the present invention is to provide a method of producing an annealed wafer wherein slip dislocations generated in a high temperature annealing can be suppressed even in the case of a silicon single crystal wafer having a large diameter of 300 mm or more, and to provide the annealed wafer.

In order to accomplish the above object, the present invention provides a method of producing an annealed wafer wherein a silicon single crystal wafer produced by the Czochralski (CZ) method is subjected to a high temperature annealing in an atmosphere of an argon gas, a hydrogen gas, or a mixture gas thereof at a temperature of 1100–1350° C. for 10–600 minutes, during the annealing the silicon single crystal wafer is supported by a supporting jig only in a central side region of the wafer except for 5 mm or less from a peripheral end of the wafer, and before performing the high temperature annealing, a pre-annealing is performed at a temperature less than the temperature of the high temperature annealing to grow oxide precipitates.

As described above, when a silicon single crystal wafer is subjected to a high temperature annealing, the silicon single crystal wafer is supported by a supporting jig only in a central side region of the wafer except for 5 mm or less from a peripheral end of the wafer, and thereby, the generation of slip dislocations can be prevented in a wafer peripheral region within 5 mm of a peripheral end of the wafer in which the amount of precipitated oxygen is lowered. Also, since slip dislocations can be suppressed by increasing the size of oxide precipitates, before performing the high temperature annealing, a pre-annealing is performed at a temperature less than the temperature of the high temperature annealing to grow oxide precipitates greatly in a wafer, and thereby, the generation of slip dislocations can be suppressed at contact parts between the wafer and the supporting jig in the central side region of the wafer.

In this case, it is preferable that the pre-annealing to grow oxide precipitates is performed within a temperature range of 950–1050° C. for 1–16 hours.

As described above, since the temperature range of the pre-annealing to grow oxide precipitates is 950° C. or more, oxide precipitates can be efficiently grown without taking a long time, and since the temperature range of the pre-annealing to grow oxide precipitates is 1050° C. or less, oxide precipitates can be grown without growing slip dislocations. Moreover, since the pre-annealing is performed for 1 hour or more, oxide precipitates can be grown to a size required for suppressing slip dislocations. However, on the other hand, if the pre-annealing is performed over 16 hours to grow oxide precipitates, a wafer is easy to be deformed by the effect of oxygen precipitation, and therefore, it is preferable that the pre-annealing time is controlled within 16 hours.

Moreover, it is preferable that the region in which the silicon single crystal wafer is supported by the supporting jig is outside of 60% or more from a center of the wafer in a radius of the wafer.

As described above, if the region in which the wafer is supported by the supporting jig is outside of 60% or more from a center of the wafer in a radius of the wafer, stresses applied to the wafer can be dispersed to be well-balanced.

Furthermore, in this case, it is preferable that the silicon single crystal wafer to be subjected to the pre-annealing is doped with nitrogen at a concentration of $1\times10^{13}$–$5\times10^{15}$ atoms/cm$^3$ and contains interstitial oxygen at 10–25 ppma (JEIDA: Japan Electronic Industry Development Association standard).

As described above, when the nitrogen concentration of the wafer is $1\times10^{13}$/cm$^3$ or more, the density of oxide precipitates (for example, $1\times10^{9}$/cm$^3$ or more) effective in suppressing slip dislocations can be easily obtained, and when the nitrogen concentration is $5\times10^{15}$/cm$^3$ or less, the formation of a single crystal is not hindered when a CZ single crystal is pulled. Also, when the oxygen concentration of the wafer is 10–25 ppma (JEIDA: Japan Electronic Industry Development Association standard), a sufficient density of oxide precipitates can be obtained by the effect of nitrogen doping without generating slip dislocations originating from oxide precipitates.

And, according to the present invention, even if the silicon single crystal wafer to be subjected to the pre-annealing is a wafer having a large diameter of 300 mm or more, the generation of slip dislocations generated by the high temperature annealing can be suppressed.

Moreover, according to the present invention, there can be provided an annealed wafer, which is a high quality wafer subjected to the high temperature annealing, wherein the generation of slip dislocations is suppressed.

As explained above, according to the present invention, when the high temperature annealing of 1100° C. or more is performed, the silicon single crystal wafer is supported by the supporting jig only in a central side region of the wafer except for 5 mm or less from a peripheral end of the wafer and the pre-annealing is performed before performing the high temperature annealing at a temperature less than the temperature of the high temperature annealing, and thereby, there can be provided an annealed wafer without slip dislocations even in the case of the silicon single crystal wafer having a large diameter of 300 mm or more.

BEST MODE FOR CARRYING OUT THE INVENTION

Figure 1:
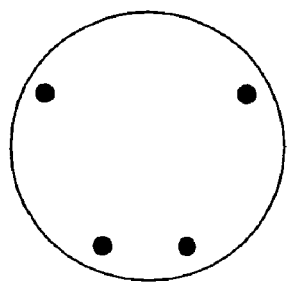
FIG. 1 is a diagram showing contact parts between a wafer and a supporting jig when the silicon wafer is supported by the supporting jig.
Figure 1:
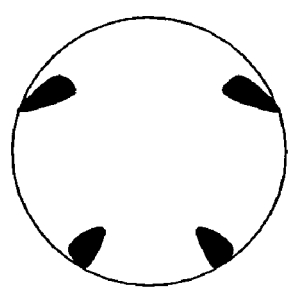
Figure 1:
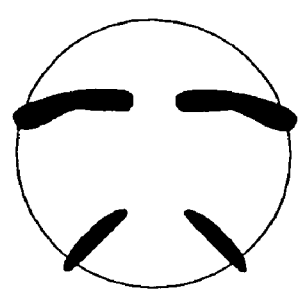

Hereinafter, embodiments of the present invention will be explained. However, the present invention is not limited thereto.

Conventionally, in a high temperature annealing in which a heat treatment is performed by using an argon gas, a hydrogen gas or the like at a high temperature (1100–1350° C.), there is a problem that when a wafer having a large diameter of 200 mm, 300 mm or more is subjected to a heat treatment, slip dislocations, which penetrate a wafer from its back side to the front, are remarkably generated.

Accordingly, inventors of the present invention has conceived that since slip dislocations are generated from contact parts between a wafer and a wafer supporting jig on the annealed wafer, when a silicon single crystal wafer is subjected to a high temperature annealing, if it is possible to suppress effectively the generation of slip dislocations at the contact parts between the silicon wafer and the supporting jig, slip dislocations generated in the wafer can be lowered even in the case of the wafer having a large diameter of 300 or more, and they accomplished the present invention by assiduous studies and investigations.

Namely, when a mirror-polished wafer, which is sliced from a single crystal ingot grown by the CZ method and polished, is subjected to a high temperature annealing in an atmosphere of an argon gas, a hydrogen gas, or a mixture gas thereof at a temperature of 1100–1350° C. for 10–600 minutes, the silicon single crystal wafer is loaded into a high temperature heat treatment furnace and the silicon single crystal wafer is supported by a supporting jig only in a center side region of the wafer except for 5 mm or less from a peripheral end thereof, and before performing the high temperature heat treatment, a pre-annealing is performed at a temperature less than the temperature of the high temperature annealing to grow oxide precipitates, and thereby, an annealed wafer in which slip dislocations generated are reduced can be produced.

A silicon wafer obtained from a silicon single crystal ingot grown by the CZ method has a part in which oxygen concentration is low in the wafer peripheral part, and therefore, a region in which the amount of precipitated oxygen is also low lies in this peripheral part. The most part of the region in which the amount of precipitated oxygen is low is generally a wafer peripheral region within 5 mm of a peripheral end of the wafer. Oxide precipitates have the effect to suppress the generation of slip dislocation. Therefore, if a silicon wafer is supported by a supporting jig in such a region in which the amount of precipitated oxygen is low and the wafer is subjected to a high temperature annealing, the effect to suppress slip dislocations is lowered as compared to a region in which the amount of precipitated oxygen is high, and the frequency of generation of slip dislocations becomes higher in an annealed wafer. Accordingly, by supporting a silicon single crystal wafer only in a center side region of the wafer except for 5 mm or less from a peripheral end of the wafer, the generation of slip dislocations can be prevented in the wafer peripheral region.

And, in this case, in order to surely suppress the generation of slip dislocations due to a high temperature annealing, it is necessary to form oxide precipitates having an enough size to suppress the growth of slip dislocations in a contact point between the silicon wafer and the supporting jig. Therefore, by performing a pre-annealing at a temperature less than the temperature of the high temperature annealing before performing the high temperature annealing, oxide precipitates can be sufficiently grown, and thereby, slip dislocations generated in a contact portion between the silicon wafer and the supporting jig can be suppressed surely.

Therefore, even in the case of a silicon single crystal wafer having a large diameter of 300 mm or more, by supporting the wafer only in a center side region of the wafer except for 5 mm or less from a peripheral end thereof when a high temperature annealing is performed and performing a pre-annealing at a temperature less than the temperature of the high temperature annealing, an annealed wafer having a large diameter without slip dislocations can be obtained.

On the other hand, in this case, if the region in which the wafer is supported is too close to a center side of the wafer, a balance of stresses applied to the wafer becomes ill (the wafer is tend to be supported only in a central region). Therefore, it is preferable that the region in which the silicon single crystal wafer is supported by a supporting jig is outside of 60% or more from a center of the wafer in a radius of the wafer.

And, when the pre-annealing is performed, in the case that the pre-annealing temperature is less than 950° C., it takes a long time to grow oxide precipitates, which is not efficient, moreover in the case that the pre-annealing temperature is over 1050° C., there is the possibility that as oxide precipitates are grown, slip dislocations are simultaneously generated or grown. Therefore, it is preferable that the temperature range for performing the pre-annealing is 950–1050° C.

Also, by performing the pre-annealing for at least 1 hour or more, oxide precipitates can be grown at an effective size in suppressing slip dislocations. However, on the other hand, if the pre-annealing is performed over 16 hours, the deformation of the wafer easily occurs due to the effect of oxygen precipitation in a subsequent heat treatment process, and therefore it is preferable that the pre-annealing time is within 16 hours.

Additionally, in this case, it is possible that the pre-annealing and the high temperature annealing of 1100° C. or more are continuously performed without unloading the wafer from the furnace, or it is also possible that after the pre-annealing, the temperature is once reduced and the wafer is unloaded from the furnace, then the wafer is loaded into the heat treatment furnace again and the high temperature annealing is performed.

Moreover, it is preferable that the wafer used in the present invention is a silicon single crystal wafer doped with nitrogen, and if the silicon single crystal wafer has been doped with nitrogen at a concentration of $1\times10^{13}/cm^3$ or more, the density of oxide precipitates ($1\times10^9/cm^3$ or more, for example), which is effective in suppressing slip dislocations, can be easily obtained. However, if the nitrogen concentration is over $5\times10^{15}/cm^3$, there is the possibility that the formation of a single crystal is prevented when a CZ single crystal is pulled, which causes decrease of productivity. Therefore, it is preferable that the concentration of nitrogen to be doped to the silicon single crystal wafer is $1\times10^{13}$–$5\times10^{15}/cm^3$.

Also, in this case, if the concentration of interstitial oxygen contained in the wafer is 10 ppma (JEIDA) or more, a sufficient density of oxide precipitates can be obtained by the effect of nitrogen doping. However, on the contrary, if the concentration of interstitial oxygen is over 25 ppma, oxide precipitation is too much, and slip dislocations caused by the precipitates are easy to be newly generated. Accordingly, it is preferable that the concentration of interstitial oxygen contained in the silicon single crystal wafer is 10–25 ppma.

The present invention will be explained more specifically as described in Examples and Comparative Examples below, but the present invention is not limited thereto.

Examples and Comparative Examples

First, raw material polycrystalline silicon was charged into a quartz crucible, a silicon wafer with a nitride film was charged thereinto, and a silicon single crystal ingot having a diameter of 300 mm, P-type, orientation <100>, and doped with nitrogen was grown by the CZ method. At that time, as for the silicon single crystal ingot obtained, the content of nitrogen was $5\times10^{13}$ atoms/cm³ (calculated value) and the content of oxygen was 14 ppma (JEIDA). After that, the single crystal ingot was sliced into wafers, and the wafers were subjected to lapping, chamfering, and polishing to prepare mirror-polished wafers.

Additionally, at that time, after a heat treatment was performed at 1050° C. for 10 hours by using the wafer having the same specification as the above mirror-polished wafers, the densities of oxide precipitates of the wafer were observed by an OPP (Optical Precipitate Profiler). As a result, the observation indicated that the density was about $1\times10^9$ numbers/cm³. Therefore, it was confirmed that there were many oxide precipitates (oxygen precipitation nuclei) which were not annihilated by the heat treatment of 1050° C. in the wafer.

Next, the mirror-polished wafers obtained were subjected to a heat treatment under annealing conditions described below. Each heat treatment described below was performed by a vertical-type furnace for 300 mm wafers (Zestone, made by Hitachi Kokusai Electric Inc.). As to wafer loading conditions into the heat treatment furnace, silicon single crystal wafers were loaded into the furnace at a temperature of 700° C., and a boat speed at that time was set at 50 mm/min. And, as to heat treatment conditions, the temperature increasing rate was set at 5° C./min, the temperature decreasing rate was set at 2° C./min, and the heat treatment atmosphere was 100% argon.

Annealing condition 1: Temperature was increased to 900° C. and maintained at 900° C. for 1 hour, and further increased to 1150° C. and maintained at 1150° C. for 1 hour. After that, the temperature was decreased and the wafer was unloaded at 700° C.

Annealing condition 2: The temperature was increased to 950° C. and maintained at 950° C. for 1 hour, and further increased to 1150° C. and maintained at 1150° C. for 1 hour. After that, the temperature was decreased and the wafer was unloaded at 700° C.

Annealing condition 3: The temperature was increased to 1000° C. and maintained at 1000° C. for 4 hour, and further increased to 1150° C. and maintained at 1150° C. for 1 hour. After that, the temperature was decreased and the wafer was unloaded at 700° C.

Annealing condition 4: The temperature was increased to 1150° C. and maintained at 1150° C. for 1 hour. After that, the temperature was decreased and the wafer was unloaded at 700° C.

Moreover, three types of supporting jigs (boats) for supporting a silicon wafer of which contact parts with the wafer was in a state as shown in FIG. 1 were prepared. In FIG. 1, black parts indicate contact parts between the silicon wafer and the boat. First, a four-point supporting boat (a) is used as a boat 1 in which supporting parts (contact parts with the boat) are provided at a position of 10 mm from a peripheral end of the wafer, an usual four-point supporting boat (b) is used as a boat 2 in which supporting parts of the wafer are provided from a wafer peripheral end to a position of 30 mm from the wafer peripheral end, and a four-point supporting boat (c) is used as a boat 3 in which supporting parts of the wafer are longer than those of a boat used usually and provided from a wafer peripheral end to a central region.

Annealing treatments were performed under the 12 conditions in total obtained by the combination of three types of boats and four kinds of annealing conditions as described above, after that, each surface of annealed wafers obtained by each condition was observed by a surface inspection apparatus SP-1 (made by KLR-Tencor Corporation) to inspect the generation of slip dislocations (total length L of slip dislocations generated). These results are shown in Table 1 as follows.

TABLE 1

|  | Boat used | Annealing condition | Generation of slip dislocation | |
|---|---|---|---|---|
|  |  |  | Wafer peripheral region | Wafer central region |
| Example 1 | Boat 1 | Condition 1 | ○ | Δ |
| Example 2 | Boat 1 | Condition 2 | ○ | ○ |
| Example 3 | Boat 1 | Condition 3 | ○ | ○ |
| Comparative Example 1 | Boat 1 | Condition 4 | ○ | X |
| Comparative Example 2 | Boat 2 | Condition 1 | X | X |
| Comparative Example 3 | Boat 2 | Condition 2 | Δ | ○ |
| Comparative Example 4 | Boat 2 | Condition 3 | Δ | ○ |
| Comparative Example 5 | Boat 2 | Condition 4 | X | X |
| Comparative Example 6 | Boat 3 | Condition 1 | X | X |
| Comparative Example 7 | Boat 3 | Condition 2 | Δ | ○ |
| Comparative Example 8 | Boat 3 | Condition 3 | Δ | ○ |
| Comparative Example 9 | Boat 3 | Condition 4 | X | X |

○: No slip dislocations were generated (L ≦ 30 mm)
Δ: Small amount of slip dislocations were generated (30 mm < L < 100 mm)
X: Slip dislocations were generated (L ≧ 100 mm)

As shown in Table 1, in the case of the annealed wafers (Examples 2 and 3) in which the boat 1 having supporting parts only in the central side region of the wafer except for 5 mm or less from the peripheral end of the wafer was used and the pre-annealing was performed at 950° C. for 1 hour (annealing condition 2) or at 1000° C. for 4 hours (annealing condition 3), the generation of slip dislocations was not observed in each wafer surface. On the other hand, when the boats 2 and 3 having contact parts with the wafer peripheral region within 5 mm from the wafer peripheral end were used, slip dislocations were observed in a wafer peripheral region even if a heat treatment was performed under the annealing condition 2 and 3 that oxide precpitates can be sufficiently grown by the pre-annealing (Comparative Examples 3, 4, 7, and 8).

On the contrary, even if the boat 1 having supporting parts only in the central side region of the wafer was used, in the case that the heat treatment was performed under the annealing condition 4 that the high temperature annealing is performed without the pre-annealing (Comparative Example 1), slip dislocations generated in contact parts with the boat were observed in a central side region of the annealed wafer obtained. Also, it is conceivable that in the case of the annealing condition 1 that the pre-annealing temperature is low and the pre-annealing time is short, the growth of oxide precipitates is insufficient (Example 1).

The present invention is not limited to the embodiment described above. The above-described embodiment is a mere example, and those having substantially the same structure as that described in the appended claims and providing the similar functions and advantages are included in the scope of the present invention.

For example, in the above Examples, the case that the atmosphere for the high temperature heat treatment is argon is taken as an example, but the present invention can be also applied similarly to the case that the high temperature heat treatment is performed in an atmosphere of hydrogen or a mixture of hydrogen and argon. Furthermore, if a heat treatment temperature and a heat treatment time of the high temperature heat treatment are within the scope of the present invention, the present invention can be applied similarly thereto.

The invention claimed is:

1. A method of producing an annealed wafer wherein a silicon single crystal wafer produced by a Czochralski (CZ) method is subjected to a high temperature annealing in an atmosphere of an argon gas, a hydrogen gas, or a mixture gas thereof at a temperature of 1100° C. –1350° C. for 10–600 minutes, during the annealing, the silicon single crystal wafer is supported by a supporting jig only in a central side region of the wafer except for 5 mm or less from a peripheral end of the wafer, and before performing the high temperature annealing, a pre-annealing to grow oxide precipitates is performed within a temperature range of 950° C. –1050° C. for 1–16 hours.

2. The method of producing an annealed wafer according to claim 1 wherein the silicon single crystal wafer to be subjected to the pre-annealing is a wafer having a large diameter of 300 mm or more.

3. An annealed wafer produced by the method of producing an annealed wafer according to claim 1.

4. The method of producing an annealed wafer according to claim 1 wherein the silicon single crystal wafer to be subjected to the pre-annealing is doped with nitrogen at a concentration of $1 \times 10^{13} – 5 \times 10^{15}$ atoms/cm$^3$ and contains interstitial oxygen at 10–25 ppma (JEIDA).

5. The method of producing an annealed wafer according to claim 4 wherein the silicon single crystal wafer to be subjected to the pre-annealing is a wafer having a large diameter of 300 mm or more.

6. The method of producing an annealed wafer according to claim 1 wherein the region in which the silicon single crystal wafer is supported by the supporting jig is outside of 60% or more from a center of the wafer in a radius of the wafer.

7. The method of producing an annealed wafer according to claim 6 wherein the silicon single crystal wafer to be subjected to the pre-annealing is a wafer having a large diameter of 300 mm or more.

8. The method of producing an annealed wafer according to claim 6 wherein the silicon single crystal wafer to be subjected to the pre-annealing is doped with nitrogen at a concentration of $1 \times 10^{13} – 5 \times 10^{15}$ atoms/cm$^3$ and contains interstitial oxygen at 10–25 ppma (JEIDA).

9. The method of producing an annealed wafer according to claim 8 wherein the silicon single crystal wafer to be subjected to the pre-annealing is a wafer having a large diameter of 300 mm or more.

* * * * *